(12) United States Patent
Liao et al.

(10) Patent No.: US 6,781,149 B1
(45) Date of Patent: Aug. 24, 2004

(54) OLED DEVICE WITH A PERFORMANCE-ENHANCING LAYER

(75) Inventors: Liang-Sheng Liao, Rochester, NY (US); Joseph K. Madathil, Rochester, NY (US); Kevin P. Klubek, Webster, NY (US); Dustin L. Comfort, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/366,835

(22) Filed: Feb. 14, 2003

(51) Int. Cl.[7] .............................................. H01L 51/00
(52) U.S. Cl. .......................... 257/40; 438/99; 313/504
(58) Field of Search ............................ 257/40; 438/99; 313/504

(56) References Cited

U.S. PATENT DOCUMENTS 5,937,272 A   8/1999  Tang
6,603,139 B1 * 8/2003  Tessler et al. ................. 257/40
6,639,357 B1 * 10/2003 Parthasarathy et al. ..... 313/504

OTHER PUBLICATIONS

"A Chemical Failure Mechanism for Aluminum(III) 8–Hydroxyquinoline Light–Emitting Devices" by F. Papadimitrakopoulos, et al., Chem. Mater. 1996, 8, 1363–1365.

* cited by examiner

Primary Examiner—Sara Crane
(74) Attorney, Agent, or Firm—Raymond L. Owens

(57) ABSTRACT

An organic light-emitting device with improved performance including an anode formed over a substrate; a light-emitting layer formed over the anode for producing light in response to hole-electron recombination; and a performance-enhancing layer formed over the light-emitting layer including one or more chemical reducing materials selected to improve the performance of the organic light-emitting device. The device also includes an electron-transporting layer formed over the performance-enhancing layer, and a cathode formed over the electron-transporting layer.

16 Claims, 2 Drawing Sheets

OLED DEVICE WITH A PERFORMANCE-ENHANCING LAYER

CROSS REFERENCE TO RELATED APPLICATIONS

Reference is made to commonly assigned U.S. patent application Ser. No. 10/060,837 filed Jan. 30, 2002 by Mitchell Burberry et al., entitled "Using Spacer Elements to Make Electroluminescent Display Devices"; commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer"; and to commonly assigned U.S. patent application Ser. No. 10/336,945 filed Feb. 14, 2003 by Michael L. Boroson et al., entitled "Forming an OLED Device with a Performance-Enhancing Layer", the disclosures of which are herein incorporated by reference.

FIELD OF THE INVENTION

The present invention relates to organic electroluminescent (EL) devices, also known as organic light-emitting diodes (OLED) that emit color light.

BACKGROUND OF THE INVENTION

In color or full-color organic electroluminescent (EL) displays (also known as organic light-emitting diode devices, or OLED devices) an array of colored pixels is provided. These pixels can include red, green, and blue color pixels (commonly referred to as RGB pixels). These pixels are precision patterned. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer or light-emitting layer of the organic EL medium. Other organic layers present in the organic EL medium can primarily provide charge transport functions and are referred to as either the hole-transporting layer (for hole transport) or electron-transporting layer (for electron transport). In forming the RGB pixels in a full-color OLED display panel, it is necessary to devise a method to precisely pattern the emissive layer of the organic EL medium or the entire organic EL medium.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask.

The EL material transfer is preferably done under conditions of reduced oxygen and/or water, using a chamber such as Tang describes in the aforementioned patent. The use of vacuum or reduced pressure can facilitate the transfer of the EL material from the source to the substrate. The use of such conditions during transfer is also advantageous in that some EL materials are sensitive to oxygen and/or moisture. For example, tris(8-quinolinolato)-aluminum(III) (Alq), which is used in OLED devices, is known to react with water [F. Papadimitrakopoulos et al., Chem. Mater. 8, 1363 (1996)]. The use of a vacuum or low oxygen and/or water conditions during the transfer step can help reduce the failure rate of OLED devices. However, inadvertent contamination of the device by oxygen, moisture, and/or other components is possible during or between deposition steps or anytime there is an apparatus transfer or delay between steps. This can lead to reduced yields of OLED displays due to luminance quenching of the light-emitting layer by the contaminants.

SUMMARY OF THE INVENTION

It is therefore an object of the present invention to reduce the effects of contamination of an OLED device by air or other species.

This object is achieved by an organic light-emitting device with improved performance comprising:
  a) an anode formed over a substrate;
  b) a hole-transporting layer formed over the anode;
  c) a light-emitting layer formed over the hole-transporting layer for producing light in response to hole-electron recombination;
  d) a performance-enhancing layer formed over the light-emitting layer including one or more chemical reducing materials selected to improve the performance of the organic light-emitting device;
  e) an electron-transporting layer formed over the performance-enhancing layer, and
  f) a cathode formed over the electron-transporting layer.

ADVANTAGES

It is an advantage of this invention that it can reverse the loss of luminance in an OLED device due to exposure of the OLED layers to air or due to a delay during manufacturing. It is a further advantage that an OLED device manufactured in accordance with this invention has improved operational stability.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" is used in its art-recognized meaning of a display device comprising organic light-emitting diodes as pixels and will also be referred to as an organic light-emitting device. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of producing light in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to produce blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1:
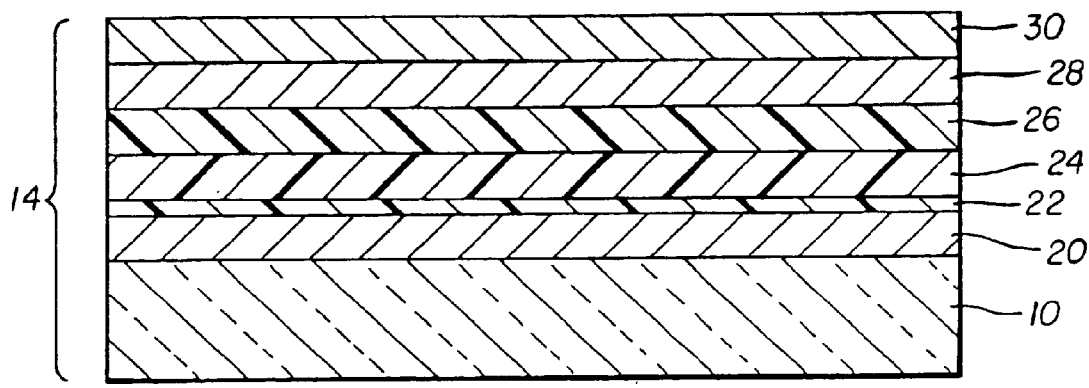
FIG. 1 shows a cross-sectional view of a prior art OLED device.

Turning now to FIG. 1, there is shown a cross-sectional view of a prior art OLED device. OLED device 14 includes substrate 10. Substrate 10 can be an organic solid, an inorganic solid, or a combination of organic and inorganic solids that provides a surface for receiving organic material from a donor. Substrate 10 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 10 can be a homogeneous mixture of materials, a composite of materials, or multiple layers of materials. Substrate 10 can be an OLED substrate, that is a substrate commonly used for preparing OLED devices, e.g. active-matrix low-temperature polysilicon TFT substrate. The substrate 10 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

Anode 20 is formed over substrate 10. When EL emission is viewed through the substrate 10, anode should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 22 be formed over anode 20 in an organic light-emitting display. The hole-injecting material can serve to improve the film formation property of subsequent organic layers and to facilitate injection of holes into the hole-transporting layer. Suitable materials for use in the hole-injecting layer 22 include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

While not always necessary, it is often useful that a hole-transporting layer 24 be formed over hole-injecting layer 22, or over anode 20 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 24 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

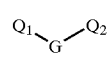

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

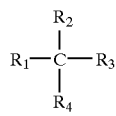

where:

R₁ and R₂ each independently represent a hydrogen atom, an aryl group, or an alkyl group or R₁ and R₂ together represent the atoms completing a cycloalkyl group; and R₃ and R₄ each independently represent an aryl group, which is in turn substituted with a diaryl substituted amino group, as indicated by structural Formula C.

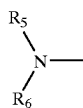

wherein R₅ and R₆ are independently selected aryl groups. In one embodiment, at least one of R₅ or R₆ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

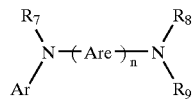

wherein:

each Are is an independently selected arylene group, such as a phenylene or anthracene moiety;

n is an integer of from 1 to 4; and

Ar, R₇, R₈, and R₉ are independently selected aryl groups.

In a typical embodiment, at least one of Ar, R₇, R₈, and R₉ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

A light-emitting layer 26 producing light in response to hole-electron recombination is formed over anode 20 and over any other layers formed, such as hole-transporting layer 24. Desired organic light-emitting materials can be deposited by any suitable means such as evaporation, sputtering, chemical vapor deposition, electrochemical means, or radiation transfer from a donor material. Useful organic light-emitting materials are well known. As more fully described in U.S. Pat. Nos. 4,769,292 and 5,935,721, the light-emitting layer 26 of the organic EL element comprises a luminescent or fluorescent material where electroluminescence is produced as a result of electron-hole pair recombination in this region. The light-emitting layer 26 can be comprised of a single material, but more commonly includes a host material doped with a guest compound or dopant where light emission comes primarily from the dopant and can be of any color. The host materials in the light-emitting layer 26 can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

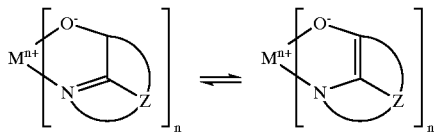

E wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-µ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

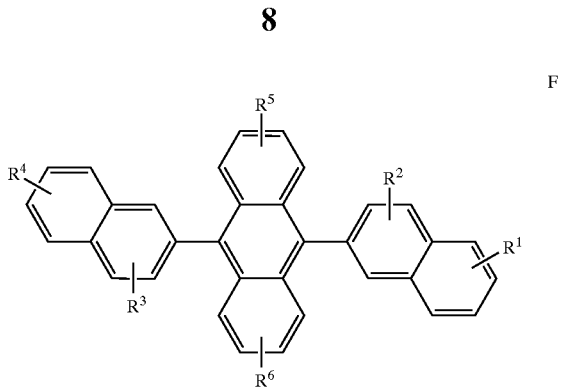

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

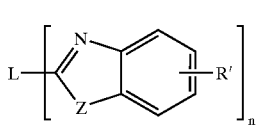

G where:

n is an integer of 3 to 8;

Z is O, NR or S;

R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

-continued
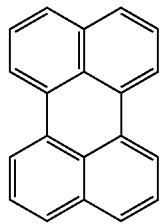
L1
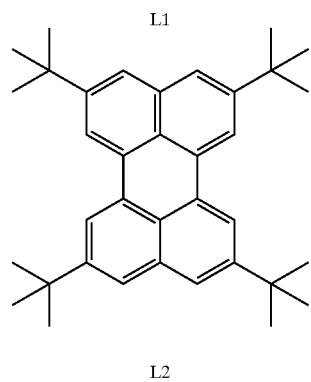
L2
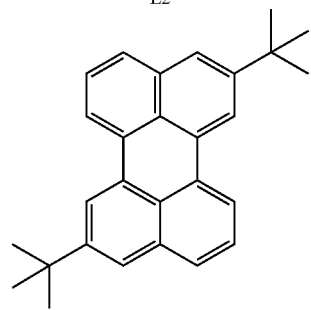
L3
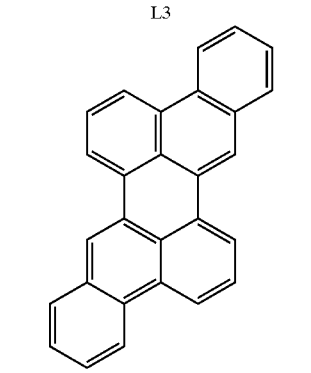
L4
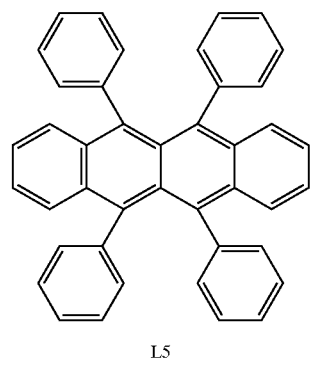
L5
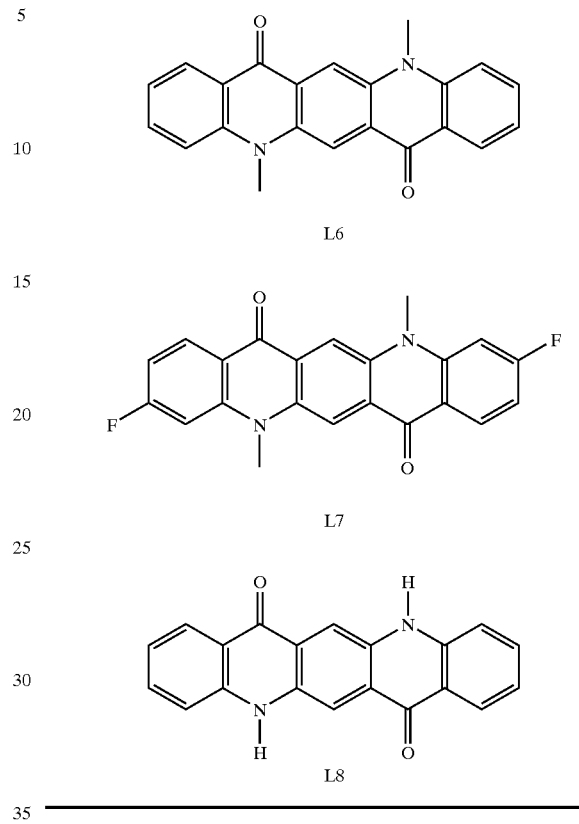
L6
L7
L8
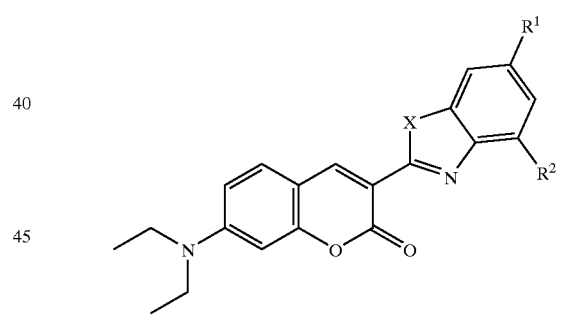
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

-continued
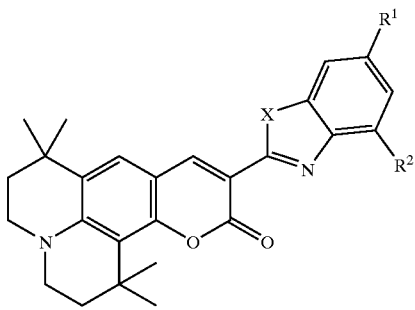
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
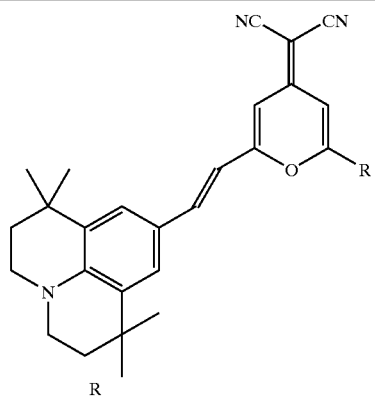
| | R |
|---|---|
| L37 | phenyl |
| L38 | methyl |
| L39 | t-butyl |
| L40 | mesityl |
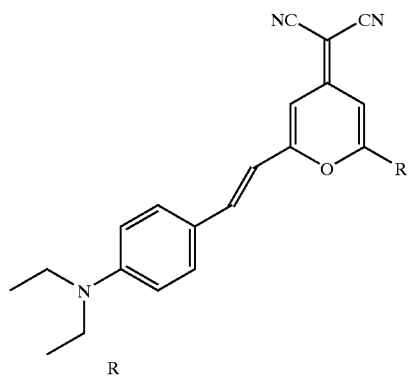
| | R |
|---|---|
| L41 | phenyl |
| L42 | methyl |
| L43 | t-butyl |
| L44 | mesityl |
-continued
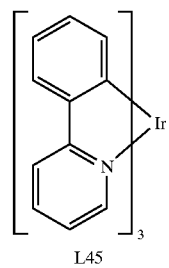
L45
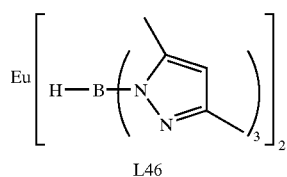
L46
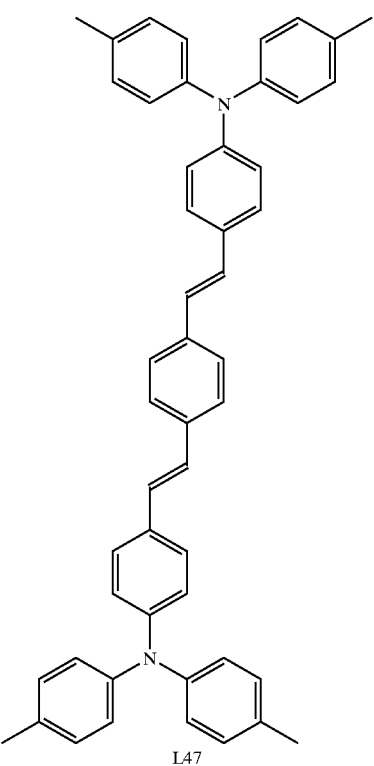
L47
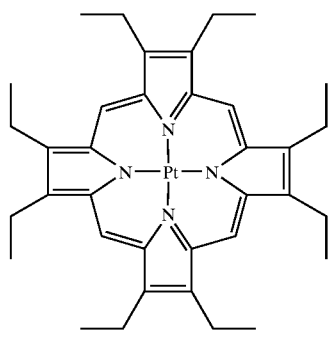
L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Although not shown, light-emitting layer 26 can additionally comprise two or more emissive layers, if such is desired for proper emissive properties of the resulting OLED device.

Electron-transporting layer 28 is formed over light-emitting layer 26. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 28 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

Cathode 30 is formed over electron-transporting layer 28. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 2:
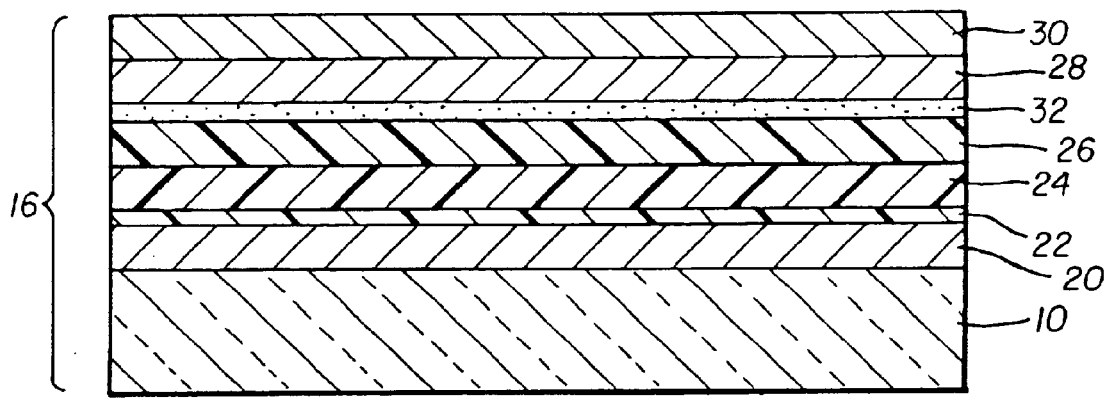
FIG. 2 shows a cross-sectional view of one embodiment of an OLED device prepared with a performance-enhancing layer over the light-emitting layer in accordance with this invention.

Turning now to FIG. 2, there is shown a cross-sectional view of one embodiment of an OLED device with improved performance prepared with a performance-enhancing layer over the light-emitting layer in accordance with this invention. Performance-enhancing layer 32 is formed over light-emitting layer 26 and under electron-transporting layer 28. Performance-enhancing layer 32 includes one or more chemical reducing materials selected to improve the performance of the OLED device 16. The term "chemical reducing materials" as used in this specification means that these materials have electron-donating properties. Performance-enhancing layer 32 can comprise a metallic material such as an alkali metal (e.g. lithium, sodium), an alkaline earth metal (e.g. barium, magnesium), or a metal from the lanthanide group (e.g. lanthanum, neodymium, lutetium) or combinations thereof. Performance-enhancing layer 32 can also comprise one or more organic chemical reducing materials, e.g. bis(ethylenedithio)tetra-thiafulvalene (BEDT-TTF), tetrathiafulvalene (TTF) or derivatives thereof. Performance-enhancing layer 32 can be formed by two or more different materials sequentially deposited or codeposited, at least one of which is chosen from the above materials. The performance-enhancing layer 32 has a thickness of 0.01 to 1 nm, and preferably has a thickness of 0.02 to 0.5 nm if it comprises a metallic material. If performance-enhancing layer 32 comprises an organic chemical reducing material, it has a thickness of 0.1 to 2 nm, and preferably has a thickness of 0.1 to 1 nm. Desired performance-enhancing materials can be deposited by any suitable means such as thermal evaporation, electron-beam evaporation, ion sputtering, or other film fabrication methods. In order to be compatible with the deposition of organic layers, performance-enhancing layer 32 is preferably formed by thermal evaporation. Performance-enhancing layer 32 is preferably deposited just before the deposition of electron-transporting layer 28.

Figure 3:
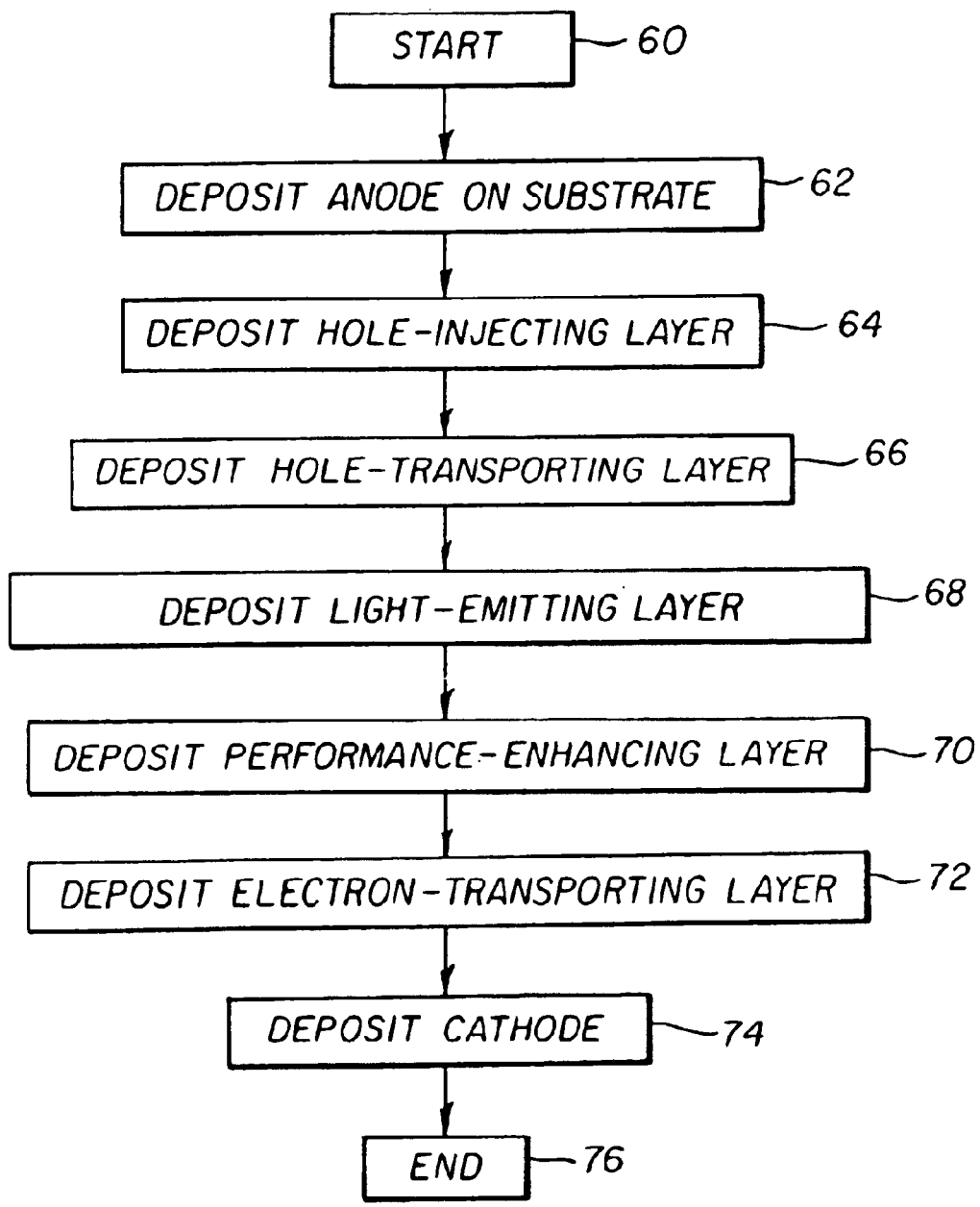
FIG. 3 is a block diagram showing the steps involved in a method according to the present invention.

Turning now to FIG. 3, and referring also to FIG. 2, there is shown a block diagram comprising the steps in one embodiment of a method for forming an organic light-emitting device according to the present invention. At the start (Step 60) of the process, anodes or patterns of anodes 20 are formed over the substrate 10 (Step 62). Alternatively, the anodes 20 can be part of the substrate 10, e.g. an OLED substrate. Then a hole-injecting layer 22 is optionally formed on the entire surface over anodes 20 (Step 64). Then a hole-transporting layer 24 is formed on the entire surface over the hole-injecting layer 22 (Step 66). Then a light-emitting layer 26, that is an emissive layer producing light in response to hole-electron recombination, is formed patternwise over the hole-transporting layer 24 (Step 68). Then a performance-enhancing layer 32 in accordance with this invention is deposited over the light-emitting layer 26 (Step 70). The performance-enhancing layer 32 includes one or more chemical reducing materials selected to improve the performance of the organic light-emitting device, as described herein. The organic light-emitting device is then completed. An electron-transporting layer 28 is formed over performance-enhancing layer 32 (Step 72 ). Then a cathode layer or a series of cathodes 30 is deposited over the electron-transporting layer 28 (Step 74). There can be further steps, for example depositing a protective layer, before the end of the process (Step 76).

The invention and its advantages can be better appreciated by the following inventive and comparative examples.

EXAMPLE 1

(Inventive Example)

An OLED device with a performance-enhancing layer satisfying the requirements of the invention was constructed in the following manner:

1. A clean glass substrate was vacuum-deposited with indium tin oxide (ITO) to form a transparent electrode of 34 nm thickness.

2. The above-prepared ITO surface was treated with a plasma oxygen etch, followed by plasma deposition of a 1.0 nm layer of a fluorocarbon polymer (CFx) as described in U.S. Pat. No. 6,208,075.

3. The above-prepared substrate was further treated by vacuum-depositing under a vacuum of approximately $10^{-6}$ Torr a 75 nm hole-transporting layer of 4,4'-bis[N-(1-naphthyl)-N-phenylamino]biphenyl (NPB) from a heated boat source.

4. A coating of 20 nm of tris(8-quinolinolato)aluminum (III) (Alq) was vacuum-deposited onto the substrate at a coating station that included a heated boat source.

5. The above substrate was exposed to the air for five minutes (to simulate air contamination), then returned to a vacuum.

6. A 0.1 nm performance-enhancing layer of lithium was evaporatively deposited onto the air-exposed Alq layer.

7. A 40 nm electron-transporting layer of tris(8-quinolinolato)aluminum (III) (Alq) was vacuum-deposited onto the substrate at a coating station that included a heated boat source.

8. A 210 nm cathode layer was deposited onto the receiver element at a coating station with separate tantalum boats, one of which contained silver and one of which contained magnesium. The cathode layer was a 20:1 volume ratio of magnesium and silver.

9. The OLED device was then transferred to a dry box for encapsulation.

EXAMPLE 2
(Comparative Example)

An OLED device was constructed in the manner described in Example 1, except that Step 6 (the deposition of a performance-enhancing layer) was skipped.

EXAMPLE 3
(Comparative Example)

An OLED device was constructed in the manner described in Example 1, except that Step 5 (exposure to air) and Step 6 (the deposition of a performance-enhancing layer) were skipped.

EXAMPLE 4
(Inventive Example)

An OLED device was constructed in the manner described in Example 1, except that Step 7 (the deposition of an electron-transporting layer) was as follows:

7. A 40 nm electron-transporting layer of tris(8-quinolinolato)-aluminum (III) (Alq) with 1.2% lithium by volume (Alq:Li) was vacuum-deposited onto the substrate at a coating station that included two heated boat sources, one each for Alq and lithium.

EXAMPLE 5
(Comparative Example)

An OLED device was constructed in the manner described in Example 4, except that Step 6 (the deposition of a performance-enhancing layer) was skipped.

EXAMPLE 6
(Comparative Example)

An OLED device was constructed in the manner described in Example 4, except that Step 5 (exposure to air) and Step 6 (the deposition of a performance-enhancing layer) were skipped.

Results

The devices in Examples 1–6 were tested by applying a constant current across the electrodes of 20 mA/cm$^2$ at room temperature and measuring the intensity and color. The following table shows the results.

| Example (Type) | Light-emitting layer (20 nm) | Air Exposure (nm) | Lithium layer (nm) | Electron-transport layer (40 nm) | Voltage @ 20 mA/cm$^2$ (V) | Luminance @ 20 mA/cm$^2$ (cd/m$^2$) |
|---|---|---|---|---|---|---|
| 1 (Inventive) | Alq | 5 | 0.1 | Alq | 8.73 | 507.2 |
| 2 (Comparative) | Alq | 5 | — | Alq | 7.23 | 285.6 |
| 3 (Comparative) | Alq | — | — | Alq | 7.64 | 460.1 |
| 4 (Inventive) | Alq | 5 | 0.1 | Alq:Li | 5.44 | 533.8 |
| 5 (Comparative) | Alq | 5 | — | Alq:Li | 6.14 | 257.4 |
| 6 (Comparative) | Alq | — | — | Alq:Li | 5.42 | 523.0 |

It is evident that exposure of the light-emitting layer to air can have a deleterious effect on the luminance of an OLED device (see Examples 2 or 3, or Examples 5 or 6). The addition of a thin lithium layer on the light-emitting layer after air exposure returns the luminance to pre-exposure levels (see Examples 1, 2, and 3, and Examples 4, 5, and 6), thus giving improved performance of the device. Moreover, experimentally it has been determined that the operational lifetime of Example 1 is similar to that of Example 3, and the operational lifetime of Example 4 is similar to that of Example 6.

Although the addition of performance-enhancing layer as described in this invention, such as a thin layer of metal, can return the luminance to pre-exposure levels, as in Example 1, the driving voltage necessary to maintain a given current density can increase (see Examples 1 or 3). However, when the electron-transporting layer is a doped Alq layer (Alq:Li), the use of a performance-enhancing layer can recover the luminance lost to air exposure while not raising the necessary driving voltage (see Example 4 or 6). Therefore, the use of a performance-enhancing layer and an electron-transporting layer codeposited with an alkali metal is a preferred embodiment of this invention.

EXAMPLE 7
(Inventive Example)

An OLED device with a performance-enhancing layer satisfying the requirements of the invention was constructed in the following manner:

1. A clean glass substrate was vacuum-deposited with indium tin oxide (ITO) to form a transparent electrode of 34 nm thickness.

2. The above-prepared ITO surface was treated with a plasma oxygen etch, followed by plasma deposition of a 1.0 nm layer of a fluorocarbon polymer ($CF_x$) as described in U.S. Pat. No. 6,208,075.

3. The above-prepared substrate was further treated by vacuum-depositing under a vacuum of approximately $10^{-6}$ Torr a 75 nm hole-transporting layer of NPB from a heated boat source.

4. A coating of a 20 nm light-emitting layer of 2-(1,1-dimethyethyl)-9,10-bis(2-naphthalenyl)anthracene (TBADN) doped with 1% 2,5,8,11-tetra-t-butylperylene (TBP) (TBADN:TBP) was vacuum-deposited onto the substrate at a coating station that included two heated boat sources, one each for TBADN and TBP.

5. The above substrate was exposed to the air for five minutes (to simulate air contamination), then returned to a vacuum.

6. A 0.1 nm performance-enhancing layer of lithium was evaporatively deposited onto the air-exposed light-emitting layer.

7. A 35 nm electron-transporting layer of Alq with 1.2% lithium by volume (Alq:Li) was vacuum-deposited onto the substrate at a coating station that included two heated boat sources, one each for Alq and Li.

8. A 210 nm cathode layer was deposited onto the receiver element at a coating station with separate tantalum boats, one of which contained silver and one of which contained magnesium. The cathode layer was a 20:1 atomic (volume) ratio of magnesium and silver.

9. The OLED device was then transferred to a dry box for encapsulation.

EXAMPLE 8
(Comparative Example)

An OLED device was constructed in the manner described in Example 7, except that Step 6 (the deposition of a performance-enhancing layer) was skipped.

EXAMPLE 9
(Comparative Example)

An OLED device was constructed in the manner described in Example 7, except that Step 5 (exposure to air) and Step 6 (the deposition of a performance-enhancing layer) were skipped.

EXAMPLE 10
(Inventive Example)

An OLED device was constructed in the manner described in Example 7, except that Step 4 (the deposition of a light-emitting layer) and Step 7 (the deposition of an electron-transporting layer) were as follows:

4. A coating of a 20 nm light-emitting layer of Alq doped with 1% 10-(2-benzothiazolyl)-1,1,7,7-tetramethyl-2,3,6,7-tetrahydro-1H,5H,11H(1)benzopyrano(6,7,8-ij)quinolizin-11-one (Green Dopant 1, or GD-1) by volume (Alq:GD-1) was vacuum-deposited onto the substrate at a coating station that included two heated boat sources, one each for Alq and GD-1.

7. A 40 nm electron-transporting layer of Alq with 1.2% lithium by volume (Alq:Li) was vacuum-deposited onto the substrate at a coating station that included two heated boat sources, one each for Alq and Li.

EXAMPLE 11
(Comparative Example)

An OLED device was constructed in the manner described in Example 10, except that Step 6 (the deposition of a performance-enhancing layer) was skipped.

EXAMPLE 12
(Comparative Example)

An OLED device was constructed in the manner described in Example 10, except that Step 5 (exposure to air) and Step 6 (the deposition of a performance-enhancing layer) were skipped.

EXAMPLE 13
(Inventive Example)

An OLED device was constructed in the manner described in Example 7, except that Step 4 (the deposition of a light-emitting layer) and Step 7 (the deposition of an electron-transporting layer) were as follows:

4. A coating of a 20 nm light-emitting layer of Alq doped with 1% 4-(dicyanomethylene)-2-t-butyl-6-(1,1,7,7,-tetramethyljulolidyl-9-enyl)-4H-pyran (DCJTB) by volume (Alq:DCJTB) was vacuum-deposited onto the substrate at a coating station that included two heated boat sources, one each for Alq and DCJTB.

7. A 55 nm electron-transporting layer of Alq with 1.2% lithium by volume (Alq:Li) was vacuum-deposited onto the substrate at a coating station that included two heated boat sources, one each for Alq and Li.

EXAMPLE 14
(Comparative Example)

An OLED device was constructed in the manner described in Example 13, except that Step 6 (the deposition of a performance-enhancing layer) was skipped.

EXAMPLE 15
(Comparative Example)

An OLED device was constructed in the manner described in Example 13, except that Step 5 (exposure to air) and Step 6 (the deposition of a performance-enhancing layer) were skipped.

The devices in Examples 7–15 were tested by applying a constant current across the electrodes of 20 mA/cm$^2$ at room temperature and measuring the intensity and color. The following table shows the results.

| Example (Type) | Light-emitting layer (20 nm) | Air Exposure (min) | Lithium layer (nm) | Electron-transport layer (thickness) | Voltage @ 20 mA/cm$^2$ (V) | Luminance @ 20 mA/cm$^2$ (cd/m$^2$) |
|---|---|---|---|---|---|---|
| 7 (Inventive) | TBADN:TBP | 5 | 0.1 | Alq:Li (35 nm) | 6.62 | 441.7 |
| 8 (Comparative) | TBADN:TBP | 5 | — | Alq:Li (35 nm) | 6.71 | 417.0 |

-continued

| Example (Type) | Light-emitting layer (20 nm) | Air Exposure (min) | Lithium layer (nm) | Electron-transport layer (thickness) | Voltage @ 20 mA/cm² (V) | Luminance @ 20 mA/cm² (cd/m²) |
|---|---|---|---|---|---|---|
| 9 (Comparative) | TBADN:TBP | — | — | Alq:Li (35 nm) | 6.77 | 446.2 |
| 10 (Inventive) | Alq:GD-1 | 5 | 0.1 | Alq:Li (40 nm) | 6.33 | 1755 |
| 11 (Comparative) | Alq:GD-1 | 5 | — | Alq:Li (40 nm) | 6.58 | 711.4 |
| 12 (Comparative) | Alq:GD-1 | — | — | Alq:Li (40 nm) | 5.83 | 1730 |
| 13 (Inventive) | Alq:DCJTB | 5 | 0.1 | Alq:Li (55 nm) | 7.23 | 584.0 |
| 14 (Comparative) | Alq:DCJTB | 5 | — | Alq:Li (55 nm) | 7.37 | 484.0 |
| 15 (Comparative) | Alq:DCJTB | — | — | Alq:Li (55 nm) | 7.10 | 602.0 |

EXAMPLE 16

(Inventive Example)

An OLED device was constructed in the manner described in Example 4.

EXAMPLE 17

(Comparative Example)

An OLED device was constructed in the manner described in Example 16, except that Step 6 (the deposition of a performance-enhancing layer) was skipped.

EXAMPLE 18

(Inventive Example)

An OLED device was constructed in the manner described in Example 16, except that in Step 5 the time for exposure to air was increased to 10 minutes.

EXAMPLE 19

(Comparative Example)

An OLED device was constructed in the manner described in Example 18, except that Step 6 (the deposition of a performance-enhancing layer) was skipped.

EXAMPLE 20

(Inventive Example)

An OLED device was constructed in the manner described in Example 16, except that in Step 5 the time for exposure to air was increased to 30 minutes.

EXAMPLE 21

(Comparative Example)

An OLED device was constructed in the manner described in Example 20, except that Step 6 (the deposition of a performance-enhancing layer) was skipped.

The devices in Examples 16–21 were tested by applying a constant current across the electrodes of 20 mA/cm² at room temperature and measuring the intensity and color. The following table shows the results.

| Example (Type) | Light-emitting layer (20 nm) | Air Exposure (min) | Lithium layer (nm) | Electron-transport layer (40 nm) | Voltage @ 20 mA/cm² (V) | Luminance @ 20 mA/cm² (cd/m²) |
|---|---|---|---|---|---|---|
| 16 (Inventive) | Alq | 5 | 0.1 | Alq:Li | 5.81 | 507.9 |
| 17 (Comparative) | Alq | 5 | — | Alq:Li | 6.04 | 361.6 |
| 18 (Inventive) | Alq | 10 | 0.1 | Alq:Li | 5.87 | 506.7 |
| 19 (Comparative) | Alq | 10 | — | Alq:Li | 6.45 | 168.9 |
| 20 (Inventive) | Alq | 30 | 0.1 | Alq:Li | 5.96 | 408.3 |
| 21 (Comparative) | Alq | 30 | — | Alq:Li | 6.49 | 5.8 |

Examples 16–21 show that the performance-enhancing layer can recover much of the luminance of an OLED device even after severe contamination of the light-emitting layer by air.

EXAMPLE 22

(Inventive Example)

An OLED device was constructed in the manner described in Example 1, except that in Step 6 a 0.3 nm layer of barium was deposited.

EXAMPLE 23

(Inventive Example)

An OLED device was constructed in the manner described in Example 1, except that in Step 6 a 0.2 nm layer of magnesium was deposited.

The devices in Examples 22–23 were tested by applying a constant current across the electrodes of 20 mA/cm² at room temperature and measuring the intensity and color and were compared to Example 2. The following table shows the results.

| Example (Type) | Light-emitting layer (20 nm) | Air Exposure (min) | Metal layer (nm) | Electron-transport layer (40 nm) | Voltage @ 20 mA/cm$^2$ (V) | Luminance @ 20 mA/cm$^2$ (cd/m$^2$) |
|---|---|---|---|---|---|---|
| 22 (Inventive) | Alq | 5 | Ba (0.3) | Alq | 8.73 | 512 |
| 23 (Inventive) | Alq | 5 | Mg (0.2) | Alq | 8.70 | 464 |
| 2 (Comparative) | Alq | 5 | — | Alq | 7.23 | 285.6 |

Examples 22 and 23 show that an alkaline earth metal can function as the performance-enhancing layer and recover luminance lost due to air exposure of the light-emitting layer.

The invention has been described in detail with particular reference to certain preferred embodiments thereof, but it will be understood that variations and modifications can be effected within the spirit and scope of the invention.

PARTS LIST 10 substrate
14 OLED device
16 OLED device (not labeled in spec?)
20 anode
22 hole-injecting layer
24 hole-transporting layer
26 light-emitting layer
28 electron-transporting layer
30 cathode
32 performance-enhancing layer
60 Step
62 Step
64 Step
66 Step
68 Step
70 Step
72 Step
74 Step
76 Step

What is claimed is:

1. An organic light-emitting device with improved performance comprising:
   a) an anode formed over a substrate;
   b) a hole-transporting layer formed over the anode;
   c) a light-emitting layer formed over the hole-transporting layer for producing light in response to hole-electron recombination;
   d) a performance-enhancing layer formed over the light-emitting layer substantially consisting of one or more chemical reducing materials selected to improve the performance of the organic light-emitting device;
   e) an electron-transporting layer formed over the performance-enhancing layer; and
   f) a cathode formed over the electron-transporting layer.

2. The organic light-emitting device of claim 1 wherein the performance-enhancing layer substantially consists of one or more metallic materials selected from the group consisting of alkali metals, alkaline earth metals, and lanthanide metals, or one or more organic chemical reducing materials selected from bis(ethylenedithio) tetrathiafulvalene, tetrathiafulvalene, and their derivatives.

3. The organic light-emitting device of claim 2 wherein the performance-enhancing layer includes lithium.

4. The organic light-emitting device of claim 2 wherein the performance-enhancing layer includes barium.

5. The organic light-emitting device of claim 1 wherein the performance-enhancing layer includes a metallic material and has a thickness in a range of from 0.01 to 1.0 nm.

6. The organic light-emitting device of claim 5 wherein the performance-enhancing layer is deposited to have a thickness in the range of 0.02 to 0.5 nm.

7. The organic light-emitting device of claim 1 wherein the performance-enhancing layer includes an organic material and has a thickness in a range of 0.1 to 2 nm.

8. The organic light-emitting device of claim 7 wherein the performance-enhancing layer has a thickness in a range of 0.1 to 1 nm.

9. The organic light-emitting device of claim 1 wherein the electron-transporting layer is codeposited with an alkali metal.

10. A method for forming a performance-enhancing layer over a light-emitting layer for use in an organic light-emitting device with improved performance comprising the steps of:
    a) after forming the light-emitting layer forming a performance-enhancing layer over the light-emitting layer substantially consisting of one or more chemical reducing materials selected to improve the performance of the organic light-emitting device; and
    b) completing the organic light-emitting device.

11. The method of claim 10 wherein the performance-enhancing layer is formed by evaporation.

12. The method of claim 10 wherein the performance-enhancing layer is formed by two or more different chemical reducing materials sequentially deposited or codeposited.

13. The method of claim 10 wherein the performance-enhancing layer includes a metallic material and has a thickness in a range of from 0.01 to 1.0 nm.

14. The method of claim 13 wherein the performance-enhancing layer is deposited to have a thickness in the range of 0.02 to 0.5 nm.

15. The method of claim 10 wherein the performance-enhancing layer includes an organic material and has a thickness in a range of 0.1 to 2 nm.

16. The method of claim 15 wherein the performance-enhancing layer has a thickness in a range of 0.1 to 1 nm.

* * * * *

UNITED STATES PATENT AND TRADEMARK OFFICE
CERTIFICATE OF CORRECTION

| | | |
|---|---|---|
| PATENT NO. | : 6,781,149 B1 | Page 1 of 1 |
| APPLICATION NO. | : 10/366835 | |
| DATED | : August 24, 2004 | |
| INVENTOR(S) | : Lian-Sheng Liao et al. | |

It is certified that error appears in the above-identified patent and that said Letters Patent is hereby corrected as shown below:

IN THE DRAWINGS

In Sheet 1 of 2, Fig. 2, please remove "(Prior Art)" from the figure's label. Fig. 2 should be shown as seen below.

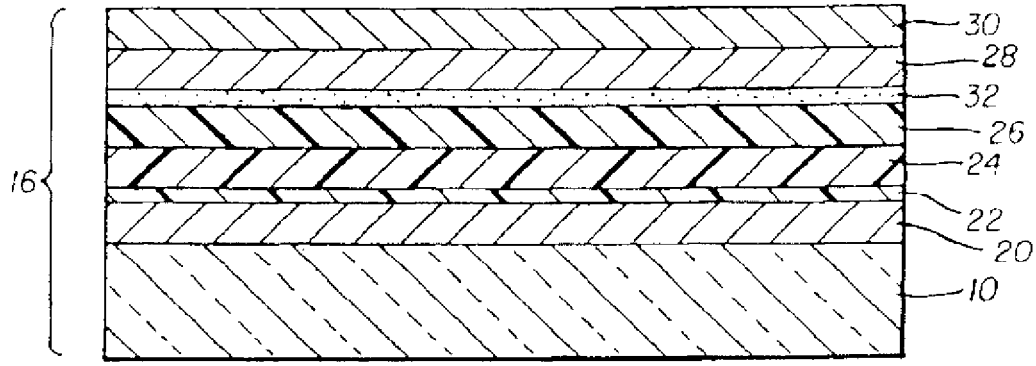

Signed and Sealed this
Fourth Day of June, 2013

Teresa Stanek Rea
*Acting Director of the United States Patent and Trademark Office*